United States Patent
Hong et al.

(10) Patent No.: US 10,896,702 B2
(45) Date of Patent: Jan. 19, 2021

(54) ELECTRONIC DEVICE AND METHOD FOR DRIVING THE SAME

(71) Applicant: SK hynix Inc., Icheon (KR)

(72) Inventors: Seok-Man Hong, Seoul (KR); Tae-Hoon Kim, Seongnam (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/547,447

(22) Filed: Aug. 21, 2019

(65) Prior Publication Data

US 2019/0378549 A1    Dec. 12, 2019

Related U.S. Application Data

(62) Division of application No. 15/824,626, filed on Nov. 28, 2017, now Pat. No. 10,431,267.

(Continued)

(51) Int. Cl.
| | | |
|---|---|---|
| G11C 7/10 | (2006.01) | |
| G11C 11/404 | (2006.01) | |
| H01L 27/22 | (2006.01) | |
| G11C 11/407 | (2006.01) | |
| G11C 16/26 | (2006.01) | |
| G11C 13/00 | (2006.01) | |
| G11C 11/56 | (2006.01) | |

(Continued)

(52) U.S. Cl.
CPC ............ *G11C 7/1063* (2013.01); *G11C 7/062* (2013.01); *G11C 11/404* (2013.01); *G11C 11/407* (2013.01); *G11C 11/5642* (2013.01); *G11C 13/0002* (2013.01); *G11C 13/004* (2013.01); *G11C 13/0004* (2013.01); *G11C 13/0035* (2013.01); *G11C 16/26* (2013.01); *G11C 29/021* (2013.01); *G11C 29/028* (2013.01); *H01L 27/222* (2013.01); *G11C 2013/0054* (2013.01); *G11C 2013/0057* (2013.01); *G11C 2211/5641* (2013.01); *G11C 2213/72* (2013.01); *G11C 2213/76* (2013.01)

(58) Field of Classification Search
CPC ..... G11C 7/1063; G11C 11/407; G11C 16/26; G11C 11/5642; G11C 11/404; G11C 2013/0054; G11C 2013/0057; G11C 13/004; G11C 2211/5641; H01L 27/222
See application file for complete search history.

(56) References Cited

U.S. PATENT DOCUMENTS 10,090,029 B2 * 10/2018 Kim .................... G11C 13/0002
2002/0116576 A1 * 8/2002 Keshava .................. G06F 3/14
711/118

(Continued)

FOREIGN PATENT DOCUMENTS

KR    1020150020902 A    2/2015

*Primary Examiner* — Ajay Ojha

(57) ABSTRACT

An electronic device includes a semiconductor memory. The semiconductor memory may include: a memory circuit comprising a plurality of memory cells; a read circuit configured to generate a first read data signal by reading data from a read target memory cell according to a first read control signal, the read target memory cell being among the plurality of memory cells; and a control circuit configured to control the read circuit to reread the data from the read target memory cell by generating a second read control signal, the second read control signal being based on a data value of the first read data signal.

13 Claims, 9 Drawing Sheets

Related U.S. Application Data

(60) Provisional application No. 62/427,081, filed on Nov. 28, 2016.

(51) Int. Cl.
*G11C 7/06* (2006.01)
*G11C 29/02* (2006.01)

(56) References Cited

U.S. PATENT DOCUMENTS

2016/0027485 A1* 1/2016 Park .................. G11C 7/062
 365/191
2016/0217852 A1* 7/2016 Wu .................. G11C 13/004

* cited by examiner

ELECTRONIC DEVICE AND METHOD FOR DRIVING THE SAME

CROSS-REFERENCE TO RELATED APPLICATIONS

The present application is a divisional of U.S. application Ser. No. 15/824,626 filed Nov. 28, 2017, which claims priority to U.S. Provisional Patent Application No. 62/427,081, entitled "ELECTRONIC DEVICE AND METHOD OF DRIVING THE SAME" and filed on Nov. 28, 2016, which is incorporated herein by reference in its entirety.

TECHNICAL FIELD

This patent document relates to memory circuits or devices, and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices and their applications in electronic devices or systems and various implementations of an electronic device including a plurality of memory cells, which is capable of controlling a drifting characteristic distribution of the plurality of memory cells over time, and a method of driving the same.

Also, the disclosed technology in this patent document includes memory circuits or devices and their applications in electronic devices or systems and various implementations of an electronic device which is capable of extending a read window margin, and a method of driving the same.

In an implementation, there is provided an electronic device including a semiconductor memory. The semiconductor memory may include: The semiconductor memory may include: a memory circuit comprising a plurality of memory cells; a read circuit configured to generate a first read data signal by reading data from a read target memory cell according to a first read control signal, the read target memory cell being among the plurality of memory cells; and a control circuit configured to control the read circuit to reread the data from the read target memory cell by generating a second read control signal, the second read control signal being based on a data value of the first read data signal.

Implementations of the above electronic device may include one or more the following.

The read circuit may be further configured to generate a second read data signal by rereading the data from the read target memory cell according to the second read control signal. The control circuit may control the read circuit to reread the data from the read target memory cell when a value of the first read data signal corresponds to a high resistance state of the read target memory cell. The read circuit may read the read target memory cell by applying a first read voltage, and reread the read target memory cell by applying a second read voltage. The read circuit may include: a first read unit configured to selectively supply any one of the first and second read voltages to the memory circuit based on a voltage selection signal; and a second read unit configured to generate the voltage selection signal and the first read data signal based on a first cell current flowing through the read target memory cell when the first read voltage is applied, and to generate the second read data signal based on a second cell current flowing through the read target memory cell when the second read voltage is applied. The first read unit may include: a first voltage selection unit configured to select the first read voltage; a second voltage selection unit configured to select the second read voltage; and a voltage transfer unit configured to transfer the first read voltage selected by the first voltage selection unit, or the second read voltage selected by the second voltage selection unit, to the memory circuit. The second read unit may include: a current sinking unit configured to sink a reference current from a sensing node, the first or second cell current being outputted from the sensing node; and a sensing unit configured to generate, based on a voltage level of the sensing node, the voltage selection signal, the first read data signal, and the second read data signal. The sensing unit may include: a read data generator configured to generate a third read data signal at a first logic level during an initialization operation, and to generate the first read data signal at a level corresponding to the voltage level of the sensing node during a read operation; and a voltage selection signal generator configured to generate the voltage selection signal at a second logic level during the initialization operation, and to generate the voltage selection signal at a level corresponding to the voltage level of the sensing node during the read operation. During the read operation, the voltage selection signal generator may generate the voltage selection signal at the second logic level when the read target memory cell is in the low resistance state, and generate the voltage selection signal at a third logic level when the read target memory cell is in the high resistance state, the third logic level being different than the second logic level. Each of the memory cells may include: a variable resistance element having a resistance value that varies according to a current flowing across the variable resistance element; and a selecting element turned on by a voltage difference across the variable resistance element. The variable resistance element may include a phase change material, and the selecting element comprises an Ovonic Threshold Switch (OTS).

The electronic device may further include a microprocessor which includes: a control unit configured to receive a signal containing a command from outside the microprocessor, and to extract or decode the command, or to perform signal input/output control of the microprocessor; an operational unit configured to perform an operation according to a result of decoding the command by the control unit; and a memory unit configured to store first data for performing the operation, second data corresponding to the operation result, or an address of the first data for performing the operation, wherein the semiconductor memory may be a part of the memory unit in the microprocessor.

The electronic device may further include a processor which includes: a core unit configured to perform an operation corresponding to a command inputted from outside the processor using first data, according to the command; a cache memory unit configured to store the first data for performing the operation, second data corresponding to the operation result, or an address of the data for performing the operation; and a bus interface coupled between the core unit and the cache memory unit, and configured to transmit third data between the core unit and the cache memory unit, wherein the semiconductor memory may be a part of the cache memory unit in the processor.

The electronic device may further include a processing system which includes: a processor configured to analyze a received command, and to control an operation on information according to a result of analyzing the command; an auxiliary memory device configured to store the information and a program for analyzing the command; a main memory device configured to store the program and information transferred from the auxiliary memory device, such that the processor performs the operation using the program and the information when the program is executed; and an interface device configured to perform communication between one or more of the processor, the auxiliary memory device, the main memory device, and the outside, wherein the semiconductor memory may be a part of the auxiliary memory device or the main memory device in the processing system.

The electronic device may further include a data storage system which includes: a storage device configured to store first data and to retain the stored first data regardless of supplied power; a controller suitable for controlling data input/output of the storage device according to a command inputted from an external source; a temporary storage device suitable for temporarily storing second data exchanged between the storage device and the external source; and an interface suitable for performing communication between one or more of the storage device, the controller, the temporary storage device, and an external source, wherein the semiconductor memory may be a part of the storage device or the auxiliary storage device in the data storage system.

The electronic device may further include a memory system which includes: a memory configured to store first data and to retain the stored first data regardless of supplied power; a memory controller configured to control data input/output of the memory according to a command inputted from an external source; a buffer memory configured to buffer second data exchanged between the memory and the external device; and an interface configured to perform communication between one or more of the memory, the memory controller, the buffer memory, and the external device, wherein the semiconductor memory may be a part of the memory or the buffer memory in the memory system.

In an implementation, there is provided a method of driving an electronic device including a semiconductor memory. The method may include: setting, during a test mode, first and second read voltages in consideration of a characteristic distribution of a plurality of memory cells; generating a first read data signal by reading, during a normal mode, data from a read target memory cell among the plurality of memory cells; and deciding, during the normal mode, to reread the data from the read target memory cell based on a data value of the first read data signal.

Implementations of the above method may include one or more of the following.

The setting of the first and second read voltages may include: measuring a first characteristic distribution from the plurality of memory cells before a drift occurs; measuring a second characteristic distribution from the plurality of memory cells after the drift occurs; and setting the first read voltage based on the first characteristic distribution, and setting the second read voltage based on the second characteristic distribution. The first characteristic distribution may include a first threshold voltage distribution of the plurality of memory cells when the plurality of memory cells are each in a low resistance state, and a second threshold voltage distribution of the plurality of memory cells when the plurality of memory cells are each in a high resistance state, and wherein the first read voltage may be set to level halfway between a highest voltage level in the first threshold voltage distribution and a lowest voltage level in the second threshold voltage distribution, or to a level that is closer to the highest voltage level in the first threshold voltage distribution than the lowest voltage level in the second threshold voltage distribution. The second characteristic distribution may include a third threshold voltage distribution of the plurality of memory cells when the plurality of memory cells are each in the low resistance state, and a fourth threshold voltage distribution of the plurality of memory cells when the plurality of memory cells are each in the high resistance state, and wherein the second read voltage may be set to a level that is closer to the lowest voltage level in the fourth threshold voltage distribution than the highest voltage level in the third threshold voltage distribution, or to a level that is closer to the lowest voltage level in the second threshold voltage distribution than the highest voltage level in the first threshold voltage distribution. The method may further include: generating a second read data signal by rereading the data from the read target memory cell, wherein the deciding to reread the data may include deciding to reread the data from the read target memory cell when the data value of the first read data signal corresponds to a high resistance state of the read target memory cell.

DETAILED DESCRIPTION

Various examples and implementations of the disclosed technology are described below, in detail, with reference to the accompanying drawings.

A semiconductor memory device in accordance with implementations of the disclosed technology may include a variable resistance element that exhibits a variable resistance characteristic that allows for representing different digital bits or states by different resistance values of the variable resistance element. In implementations, such a variable resistance element may include a single-layer or multi-layer structure, which exhibits the variable resistance characteristic and includes a material used in a RRAM, PRAM, STTRAM, MRAM or FRAM (e.g., a ferromagnetic material), a ferroelectric material, a phase change material such as a chalcogenide material, a metal oxide such as a perovskite material, and/or a transition metal oxide.

The variable resistance element may include a metal oxide, e.g., a transition metal oxide such as a nickel (Ni) oxide, a titanium oxide (TiO), a hafnium oxide (HfO), a zirconium oxide (ZrO), a tungsten oxide (WO), or a cobalt oxide (CoO), or a perovskite material such as a strontium titanium oxide (STO:SrTiO) or a praseodymium calcium manganese oxide (PCMO:PrCaMnO).

Moreover, the variable resistance element may include a phase change material. The phase change material may include a chalcogenide material such as germanium-antimony-tellurium (GST:GeSbTe). The variable resistance element switches between different resistance states by changing its structure into a crystalline state or an amorphous state using heat.

The variable resistance element may include two magnetic layers and a tunnel barrier layer interposed between the two magnetic layers. The magnetic layer may include nickel-ferrum-cobalt (NiFeCo) or Cobalt-ferrum (CoFe), etc. The tunnel barrier layer may include aluminum oxide $Al_2O_3$. The variable resistance element may switch between two different resistance states according to magnetization directions of the two magnetic layers. For example, the variable resistance element may be in a low resistance state when the magnetization directions of the two magnetic layers are parallel, and be in a high resistance state when the magnetization directions of the two magnetic layers are anti-parallel.

Figure 1:
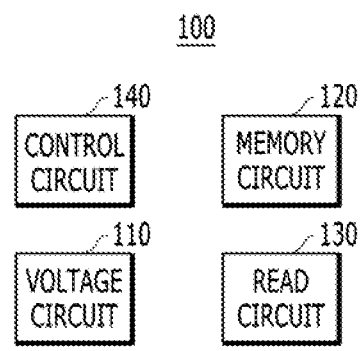
FIG. 1 is a configuration diagram of a memory device in accordance with an implementation of the present disclosure.

FIG. 1 is a block diagram illustrating a memory device 100 in accordance with an implementation of the present disclosure.

Referring to FIG. 1, the memory device 100 may include a voltage circuit 110, a memory circuit 120, a read circuit 130, and a control circuit 140.

The voltage circuit 110 may generate one or more read voltages used to conduct a read operation. For example, the voltage circuit 110 may generate a first read voltage VREAD1 to conduct a typical read operation and a second read voltage VREAD2 to conduct a reread operation. Voltage levels of the first and second read voltages VREAD1 and VREAD2 may be set when the memory device 100 is operating in a test mode.

The memory circuit 120 may include a memory array and a peripheral circuit. The memory array may include a plurality of memory cells, and may have a cross-point array architecture. The peripheral circuit may include a selection circuit for selecting one or more of the plurality of memory cells.

The read circuit 130 may generate a read data signal RD_OUT by reading data from a read target memory cell among the plurality of memory cells. The read target memory cell may be reread one or more times. For example, the read circuit 130 may generate the read data signal RD_OUT using the first read voltage VREAD1 during the typical read operation, and generate the read data signal RD_OUT using the second read voltage VREAD2 during the reread operation.

In an implementation, the read circuit 130 reads data from more than one read target memory cell among the plurality of memory cells.

The control circuit 140 may control overall operations of the voltage circuit 110, the memory circuit 120, and the read circuit 130. In particular, the control circuit 140 may determine whether the read circuit 130 will reread data from the read target memory cell, based on a data value of the read data signal RD_OUT previously generated by the read circuit 130. For example, the control circuit 140 may control the read circuit 130 to reread the data from the read target memory cell when a value of the previously obtained read data signal RD_OUT indicates that the read target memory cell has a high resistance state.

In an implementation, the control circuit 140 controls the read circuit 130 to read or reread the data of the read target memory cell by generating and outputting a read control signal to the read circuit 130.

Figure 2:
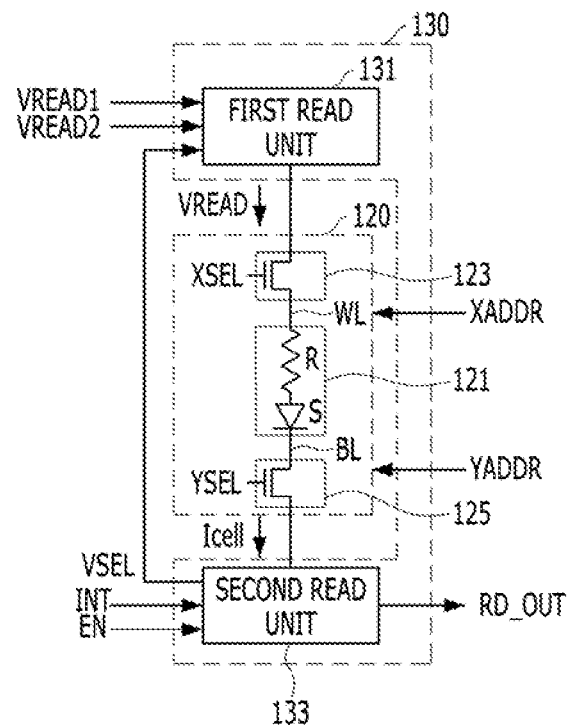
FIG. 2 is a configuration diagram of a memory circuit and a read circuit in accordance with an implementation of the present disclosure.

FIG. 2 is a configuration diagram of a memory circuit and a read circuit according to an implementation of the present disclosure. For example, the memory circuit and the read circuit are the memory circuit 120 and the read circuit 130, respectively, illustrated in FIG. 1.

Referring to FIG. 2, the memory circuit 120 may include a memory cell 121, a row selection unit 123, and a column selection unit 125.

The memory cell 121 may include a variable resistance element R and a selecting element S, which are coupled to each other in series between a word line WL and a bit line BL. The variable resistance element R may have a variable resistance characteristic, and may include, for example, a phase change material. In this case, the variable resistance element R may have a high resistance state when the phase change material is in an amorphous phase, and a low resistance state when the phase change material is in a crystalline phase. The selecting element S may include a diode or an OTS (Ovonic Threshold Switch). In this case, the selecting element S may switch between different resistance states depending on a voltage drop across the memory cell 121 and/or a voltage difference between the word line WL and the bit line BL.

The memory cell 121 may have a drifting resistance characteristic, in which a resistance of the memory cell 121 changes over time. For example, the memory cell 121 may experience a drift phenomenon. When the memory cell 121 experiences a drift phenomenon, a resistance value of the memory cell 121 in a specific resistance state drifts over time. In other words, a resistance value, corresponding to a specific type of data written to the memory cell 121, changes with time. The drift may be related to a material included in the variable resistance element R and the selecting element S. When the drift occurs, the data stored in the memory cell 121 may unintentionally change without setting or resetting the memory cell 121. As a result of the drifting resistance value, during a read operation, wrong data may be read from the memory cell 121.

The row selection unit 123 may selectively couple the memory cell 121 to a first read unit 131, based on a row selection signal XSEL. Implementations of the first read unit 131 are described below with reference to FIG. 3.

The column selection unit 125 may selectively couple the memory cell 121 to a second read unit 133, based on a column selection signal YSEL. Implementations of the second read unit 133 are described below with reference to FIG. 4.

For reference, although not illustrated, the memory circuit 120 may further include a decoder for generating the row selection signal XSEL and the column selection signal YSEL. The decoder may generate the row selection signal XSEL based on a row address XADDR, and generate the column selection signal YSEL based on a column address YADDR. The row address XADDR and the column address YADDR may be generated by the control circuit 140.

The present implementation is based on the configuration that the memory circuit 120 including the memory cell 121, the row selection unit 123, and the column selection unit 125. However, the present implementation is not limited thereto. For example, the memory circuit 120 may include a plurality of memory cells, a plurality of row selection units, and a plurality of column selection units.

The read circuit 130 may include the first read unit 131 and the second read unit 133.

The first read unit 131 may receive a voltage selection signal VSEL, and selectively supply any one of the first and second read voltages VREAD1 and VREAD2 to the memory circuit 120 based on the voltage selection signal VSEL.

The second read unit 133 may receive a cell current Icell that is generated through the memory circuit 120, and generate the read data signal RD_OUT and the voltage selection signal VSEL according to a read control signal EN. In an implementation, the read control signal EN is generated by a control circuit, e.g., the control circuit 140 illustrated in FIG. 1.

The read data signal RD_OUT and the voltage selection signal VSEL correspond to the cell current Icell generated through the memory circuit 120. For example, the second read unit 133 may generate the read data signal RD_OUT and the voltage selection signal VSEL by comparing the cell current Icell to a reference current Iref (refer to FIG. 4).

The second read unit 133 may initialize the voltage selection signal VSEL to a predetermined logic level based on an initialization control signal INT, regardless of the cell current Icell. The read control signal EN may have an active period that does not overlap with an active period of the initialization control signal INT.

Figure 3:
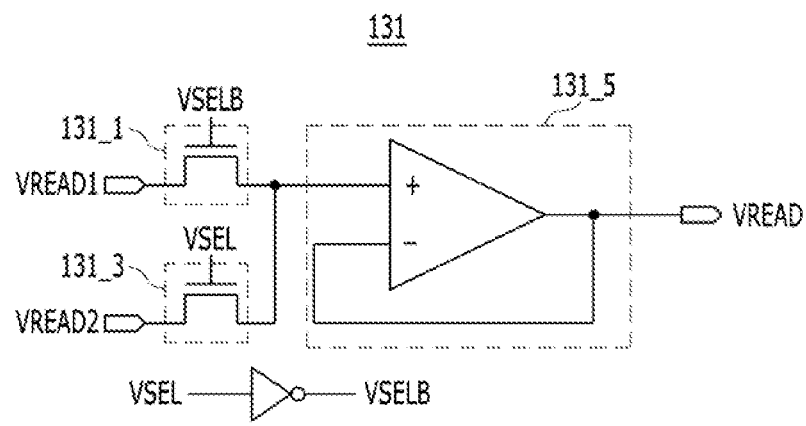
FIG. 3 is a configuration diagram of a first read unit in accordance with an implementation of the present disclosure.

FIG. 3 is a configuration diagram of a first read unit according to an implementation of the present disclosure. For example, the first read unit illustrated in FIG. 3 is the first read unit 131 illustrated in FIG. 2.

Referring to FIG. 3, the first read unit 131 may include a first voltage selection unit 131_1, a second voltage selection unit 131_3, and a voltage transfer unit 131_5.

The first voltage selection unit 131_1 may receive an inverted voltage selection signal VSELB, and may selectively supply the first read voltage VREAD1 to the voltage transfer unit 131_5 based on the inverted voltage selection signal VSELB. The inverted voltage selection signal VSELB may correspond to an inverted signal of the voltage selection signal VSEL. For example, the inverted voltage selection signal VSELB may be activated when the voltage selection signal VSEL is deactivated, and vice versa.

The second voltage selection unit 131_3 may receive the voltage selection signal VSEL, and may selectively supply the second read voltage VREAD2 to the voltage transfer unit 131_5 based on the voltage selection signal VSEL.

The voltage transfer unit 131_5 may receive the first or second read voltage VREAD1 or VREAD2 from the first or second voltage selection unit 131_1 or 131_3, and may transfer the received first or second read voltage VREAD1 or VREAD2 to the memory circuit 120 as a read voltage VREAD. That is, the read voltage VREAD output by the first read unit 131 may be equal to the first read voltage VREAD1 or the second read voltage VREAD2. For example, the voltage transfer unit 131_5 may include a voltage follower.

Figure 4:
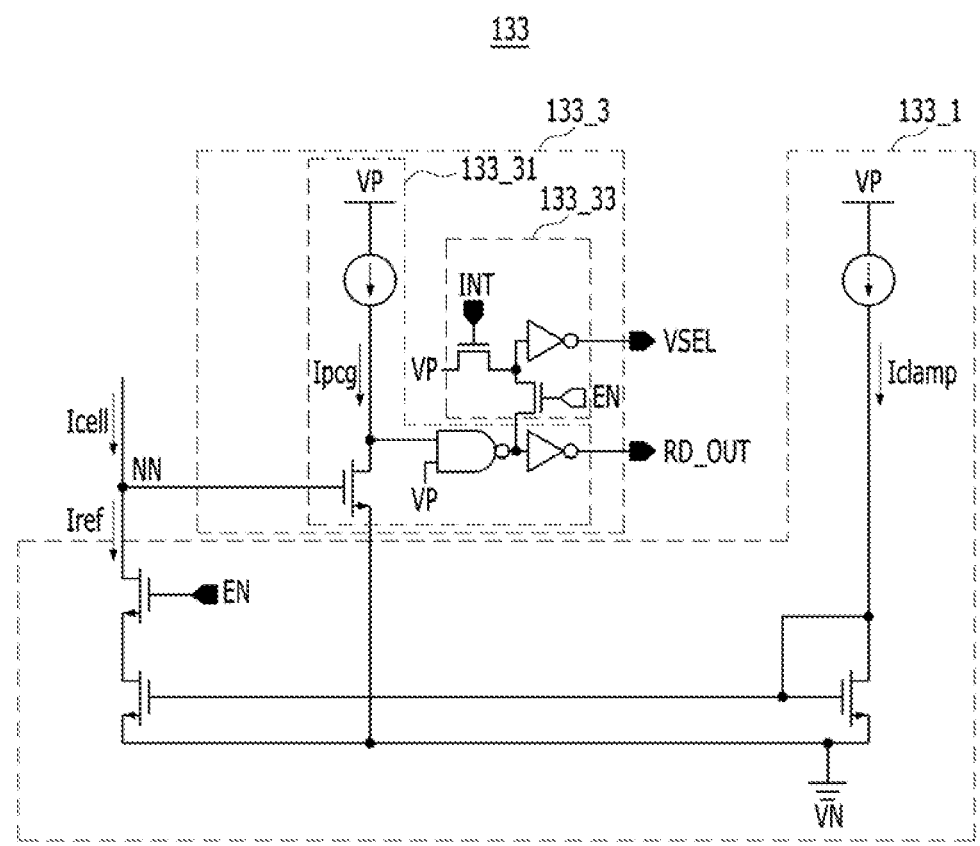
FIG. 4 is a configuration diagram of a second read unit in accordance with an implementation of the present disclosure.

FIG. 4 is a configuration diagram of a second read unit according to an implementation of the present disclosure. For example, the second read unit illustrated in FIG. 4 is the second read unit 133 illustrated in FIG. 2.

Referring to FIG. 4, the second read unit 133 may include a current sinking unit 133_1 and a sensing unit 133_3.

The current sinking unit 133_1 may sink the reference current Iref from a sensing node NN based on the read control signal EN. The reference current Iref corresponds to a clamp current Iclamp. For example, the current sinking unit 133_1 may generate the reference current Iref by mirroring the clamp current Iclamp. In an example, the reference current Iref may be set to a higher level than the cell current Icell when the memory cell 121 is in the high resistance state, and set to a lower level than the cell current Icell when the memory cell 121 is in the low resistance state.

The sensing unit 133_3 may include a read data generator 133_31 and a voltage selection signal generator 133_33.

The read data signal RD_OUT generated by the read data generator 133_31 may be defined differently during different operations. During an initialization operation, the read data generator 133_31 generates the read data signal RD_OUT at a logic high level based on a precharge current Ipcg. The high-level read data signal RD_OUT corresponds to a positive voltage VP.

During the read operation, the read data signal RD_OUT corresponds to a voltage level of the sensing node NN. The voltage level of the sensing node NN may be defined by the cell current Icell and the reference current Iref.

For example, when the reference current Iref is higher than the cell current Icell, the voltage level of the sensing node NN may correspond to a negative voltage VN. When the memory cell 121 is in the high resistance state, the voltage level of the sensing node NN may correspond to the negative voltage VN. When the voltage level of the sensing node NN corresponds to the negative voltage VN, the read data generator 133_31 may generate the read data signal RD_OUT at a logic high level based on the precharge current Ipcg. The high-level read data signal RD_OUT may correspond to the positive voltage VP.

On the other hand, when the cell current Icell is higher than the reference current Iref or when the memory cell 121 is in the low resistance state, the voltage level of the sensing node NN may correspond to the read voltage VREAD. When the voltage level of the sensing node NN corresponds to the read voltage VREAD, the read data generator 133_31 may generate the read data signal RD_OUT at a logic low level, regardless of the precharge current Ipcg. The low-level read data signal RD_OUT may correspond to the negative voltage VN.

In other words, according to an implementation, the read data signal RD_OUT is generated at a logic high level corresponding to the positive voltage VP when the memory cell 121 is in the high resistance state, and is generated at a logic low level corresponding to the negative voltage VN when the memory cell 121 is in the low resistance state.

During the initialization operation, the voltage selection signal generator 133_33 may generate the voltage selection signal VSEL at a logic low level based on the initialization control signal INT. For example, the voltage selection signal generator 133_33 may generate the low-level voltage selection signal VSEL by inverting the positive voltage VP during the initialization operation, in which the initialization control signal INT is enabled at a logic high level.

During the read operation, the voltage selection signal generator 133_33 may generate the voltage selection signal VSEL at a level corresponding to the voltage level of the sensing node NN based on the read control signal EN and the initialization control signal INT. The read control signal EN is enabled at a logic high level, and the initialization control signal INT is disabled at a logic low level. As described above, the voltage level of the sensing node NN may be defined by the cell current Icell and the reference current Iref. For example, when the reference current Iref is higher than the cell current Icell (i.e., the memory cell 121 is in the high resistance state), the voltage level of the sensing node NN may correspond to the negative voltage VN. When the voltage sensing node NN corresponds to the negative voltage VN, the voltage selection signal generator 133_33 may generate the voltage selection signal VSEL at a logic high level based on the precharge current Ipcg. The high-level voltage selection signal VSEL corresponds to the positive voltage VP. Accordingly, the voltage selection signal generator 133_33 generates the voltage selection signal VSEL at a logic high level when the memory cell 121 is in the high resistance state.

On the other hand, when the cell current Icell is higher than the reference current Iref (i.e., the memory cell 121 is in the low resistance state), the voltage level of the sensing node NN may correspond to the read voltage VREAD. When the voltage level of the sensing node NN corresponds to the read voltage VREAD, the voltage selection signal generator 133_33 may generate the voltage selection signal VSEL at a logic low level regardless of the precharge current Ipcg. The low-level voltage selection signal VSEL corresponds to the negative voltage VN. Accordingly, the voltage selection signal generator 133_33 generates the voltage selection signal VSEL at a logic low level corresponding to the negative voltage VN when the memory cell 121 is in the low resistance state.

The present implementation is based on a configuration in which the voltage selection signal generator 133_33 is included in the sensing unit 133_3. However, the present implementation is not limited thereto, and the voltage selection signal generator 133_33 may be outside the sensing unit 133_3 and/or included in another circuit. For example, the voltage selection signal generator 133_33 may be included in the control circuit 140. In this case, the control circuit 140 may generate the voltage selection signal VSEL based on the read data signal RD_OUT. The internal configuration of the voltage selection signal generator 133_33 may also be changed depending on design.

The logic level of the read data signal RD_OUT and the logic level of the voltage selection signal VSEL for each operation described above is summarized in Table 1 below.

TABLE 1

|  | Initialization operation | Read operation (when memory cell 121 is in high resistance state) | Read operation (when memory cell 121 is in low resistance state) |
| --- | --- | --- | --- |
| RD_OUT | H | H | L |
| VSEL | L | H | L |

The logic levels of the read data signal RD_OUT and the logic levels of the voltage selection signal VSEL may be different than the examples set forth in Table 1 above, depending on a design of the memory device 100.

Hereafter, the operation of a memory device, e.g., the memory device 100 having the above-described configuration, will be described with reference to FIGS. 5 to 9.

Figure 5:
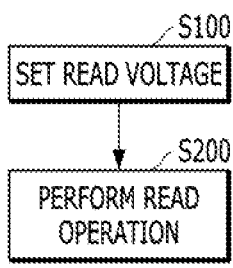
FIG. 5 is a flowchart for describing an operation of a memory device in accordance with an implementation of the present disclosure.

FIG. 5 is a flowchart for describing a method of driving a memory device in accordance with an implementation of the present disclosure.

The method of driving the memory device may include a first step S100 and a second step S200.

The first step S100 may be performed when the memory device is in a test mode. The first step S100 may include setting the first and second read voltages, e.g., VREAD1 and VREAD2, in consideration of a characteristic distribution of a plurality of memory cells included in a memory circuit of the memory device.

The second step S200 may be performed when the memory device is in a normal mode. The second step S200 may include generating a read data signal, e.g., RD_OUT, by reading data from a read target memory cell among the plurality of memory cells. In an implementation, the read data signal is generated from one or more read target memory cells among the plurality of memory cells.

Furthermore, the second step S200 may include deciding whether to reread the data from the read target memory cell based on a data value of the previously obtained read data signal RD_OUT. When the data is reread from the read target memory cell, the read data signal RD_OUT is generated again. The following descriptions will be based on the supposition that the memory cell 121 of FIG. 2 is the read target memory cell, for convenience of description.

Figure 6:
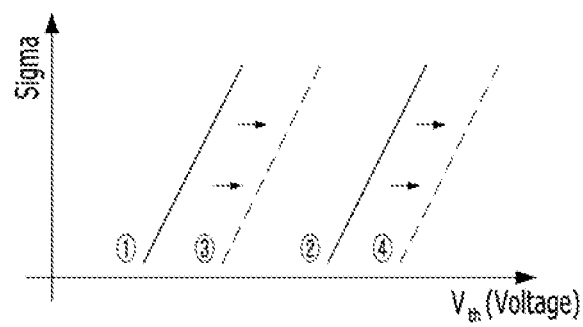
FIG. 6 is a graph for describing a first step of an operation of a memory device in accordance with an implementation of the present disclosure.

FIG. 6 is a graph for additionally describing a first step of driving a memory cell according to an implementation of the present disclosure, e.g., the first step S100 of FIG. 5.

Referring to FIG. 6, a first threshold voltage distribution ① and a second threshold voltage distribution ② may indicate a first characteristic distribution of the plurality of memory cells before the resistance values of the plurality of memory cells are drifted. The first threshold voltage distribution ① may correspond to a distribution of the resistance values of the plurality of memory cells before the resistance values are drifted, when the plurality of memory cells are each in the low resistance state. The second threshold voltage distribution ② may correspond to a distribution of the resistance values of the plurality of memory cells before the resistance values are drifted, when the plurality of memory cells are each in the high resistance state.

A third threshold voltage distribution ③ and a fourth threshold voltage distribution ④ may indicate a second characteristic distribution of the plurality of memory cells after the resistance values of the plurality of memory cells are drifted. The third threshold voltage distribution ③ may correspond to a distribution of the resistance values of the plurality of memory cells after the resistance values are drifted, when the plurality of memory cells are each in the low resistance state. The fourth threshold voltage distribution ④ may correspond to a distribution of the resistance values of the plurality of memory cells after the resistance values are drifted, when the plurality of memory cells are each in the high resistance state.

Figure 7:
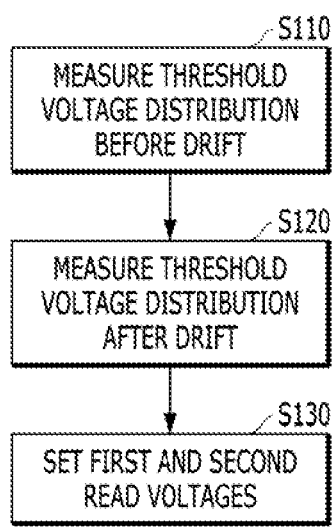
FIG. 7 is a flowchart for describing a first step of an operation of a memory device in accordance with an implementation of the present disclosure.

FIG. 7 is a flowchart for describing the first step in more detail according to an implementation of the present disclosure.

Referring to FIGS. 6 and 7, the first step, e.g., the first step S100 of FIG. 5, may include measuring the first and second threshold voltage distributions ① and ② at step S110; measuring the third and fourth threshold voltage distributions ③ and ④ at step S120; and setting the first read voltage VREAD1 based on the first and second threshold voltage distributions ① and ②, and setting the second read voltage VREAD2 based on the third and fourth threshold voltage distributions ③ and ④, at step S130.

The first threshold voltage distribution ① may be measured by reading read data from the plurality of memory cells immediately after the plurality of memory cells are written into the low resistance state. The second threshold voltage distribution ② may be measured by reading read data from the plurality of memory cells immediately after the plurality of memory cells are written into the high resistance state.

The third threshold voltage distribution ③ may be measured by reading read data from the plurality of memory cells when the plurality of memory cells are in the low resistance state at a predetermined time after the plurality of memory cells are written into the low resistance state. The fourth threshold voltage distribution ④ may be measured by reading read data from the plurality of memory cells when the plurality of memory cells are in the high resistance state at a predetermined time after the plurality of memory cells are written into the high resistance state.

The step S130 of setting the first and second read voltages VREAD1 and VREAD2 will be described with reference to FIGS. 8A to 8C.

Figure 8A:
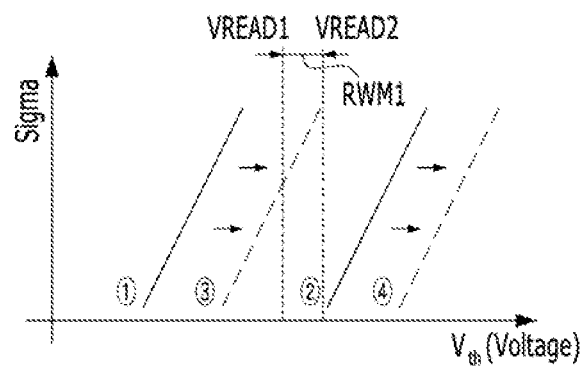
FIGS. 8A to 8C are graphs for describing first and second read voltage setting steps in accordance with an implementation of the present disclosure.

Referring to FIG. 8A, the first read voltage VREAD1 may be set to a level between the highest voltage level in the first threshold voltage distribution ① and the lowest voltage level in the second threshold voltage distribution ②. For example, the first read voltage VREAD1 may be set to level halfway between the highest voltage level in the first threshold voltage distribution ① and the lowest voltage level in the second threshold voltage distribution ②.

The second read voltage VREAD2 may be set to a level between the highest voltage level in the first threshold voltage distribution ① and the lowest voltage level in the second threshold voltage distribution ②. For example, the second read voltage VREAD2 may be set to a level that is closer to the lowest voltage level in the second threshold voltage distribution ② than the highest voltage level in the first threshold voltage distribution ①.

A difference between the first and second read voltages VREAD1 and VREAD2 may correspond to a first read window margin RWM1.

Figure 8B:
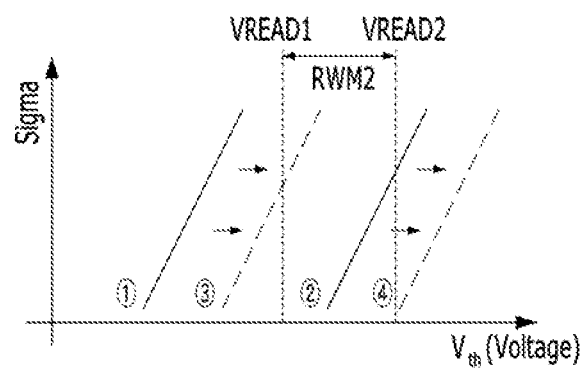

Referring to FIG. 8B, the first read voltage VREAD1 may be set to a level between the highest voltage level in the first threshold voltage distribution ① and the lowest voltage level in the second threshold voltage distribution ②. For example, the first read voltage VREAD1 may be set to a level halfway between the highest voltage level in the first threshold voltage distribution ① and the lowest voltage level in the second threshold voltage distribution ②.

The second read voltage VREAD2 may be set to a level between the highest voltage level in the third threshold voltage distribution ③ and the lowest voltage level in the fourth threshold voltage distribution ④. For example, the second read voltage VREAD2 may be set to a level that is closer to the lowest voltage level in the fourth threshold voltage distribution ④ than the highest voltage level in the third threshold voltage distribution ③.

A difference between the first and second read voltages VREAD1 and VREAD2 may correspond to a second read window margin RWM2.

FIG. 8B shows that the second read window margin RWM2 is wider than the first read window margin RWM1 according to an embodiment. The second read window margin RWM2 may widen as the second read voltage VREAD2 approaches the lowest voltage level in the fourth threshold voltage distribution ④.

Figure 8C:
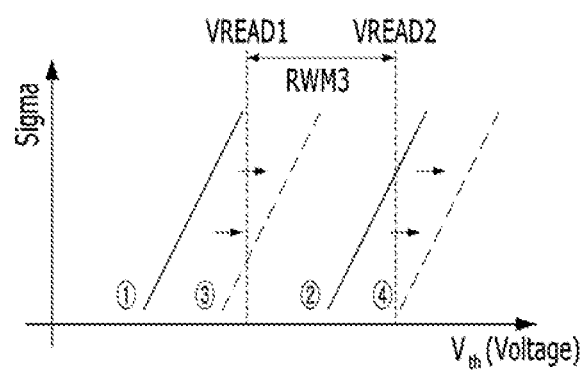

Referring to FIG. 8C, the first read voltage VREAD1 may be set to a level between the highest voltage level in the first threshold voltage distribution ① and the lowest voltage level in the second threshold voltage distribution ②. For example, the first read voltage VREAD1 may be set to a level that is closer to the highest voltage level in the first threshold voltage distribution ① than the lowest voltage level in the second threshold voltage distribution ②.

The second read voltage VREAD2 may be set to a level between the highest voltage level in the third threshold voltage distribution ③ and the lowest voltage level in the fourth threshold voltage distribution ④. For example, the second read voltage VREAD2 may be set to a level that is closer to the lowest voltage level in the fourth threshold voltage distribution ④ than the highest voltage level in the third threshold voltage distribution ③.

A difference between the first and second read voltages VREAD1 and VREAD2 may correspond to a third read window margin RWM3. FIG. 8C shows that the third read window margin RWM3 is wider than the first read window margin RWM1. The third read window margin RWM3 may widen as the first read voltage VREAD1 approaches the highest voltage level in the first threshold voltage ① and the second read voltage VREAD2 approaches the lowest voltage level in the fourth threshold distribution ④.

Figure 9:
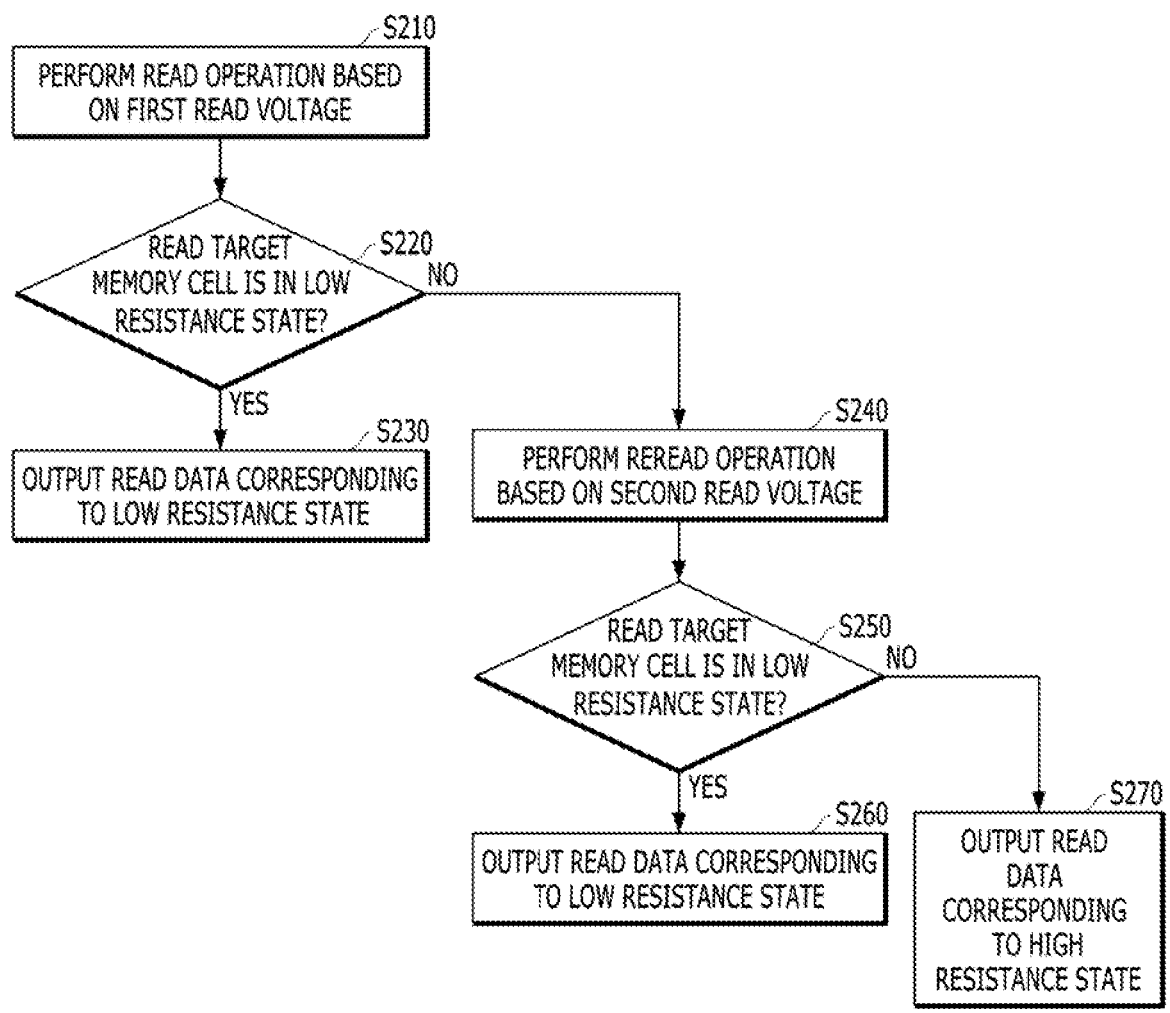
FIG. 9 is a flow chart for describing a second step of an operation of a memory device in accordance with an implementation of the present disclosure.

FIG. 9 is a flowchart for describing a second step of an operation of a memory device in accordance with an implementation of the present disclosure. For example, FIG. 9 describes the second step S200 of FIG. 5 in more detail. The second step S200 will be described with reference to FIGS. 1 to 4.

Referring to FIG. 9, the control circuit 140 may control the voltage circuit 110, the memory circuit 120, and the read circuit 130 to perform a read operation according to a read request in accordance with the present implementation.

First, a typical read operation S210 to S230 will be described.

At step S210, the first read unit 131 supplies the first read voltage VREAD1 to the memory circuit 120 based on the low-level voltage selection signal VSEL. In turn, the memory circuit 120 may generate the cell current Icell, which corresponds to the resistance state of the read target memory cell 121, based on the first read voltage VREAD1, also at step S210. For example, the cell current Icell generated by the memory circuit 120 may be higher than the reference current Iref when the read target memory cell 121 is in the low resistance state.

The second read unit 133 may compare the reference current Iref and the cell current Icell at step S220. When a result of the comparison indicates that the cell current Icell is higher than the reference current Iref, the second read unit 133 may determine that the read target memory cell 121 is in the low resistance state.

When the second read unit 133 determines that the read target memory cell 121 is in the low resistance state, the second read unit 133 generates the low-level read data signal RD_OUT corresponding to the negative voltage VN at step S230. Since the negative voltage VN is independent of the precharge current Ipcg, the low-level read data signal RD_OUT is generated regardless of the value of the precharge current Ipcg. The second read unit 133 may continuously generate the low-level voltage selection signal VSEL.

Next, the reread operation S240 to S270 of the read operation will be described.

When the result of the comparison at step S220 indicates that the reference current Iref is higher than the cell current Icell, it is determined that the read target memory cell 121 may have experienced a drift phenomenon, or the read target memory cell 121 is in the high resistance state. Thus, the second read unit 133 may initiate the reread operation, and generate the high-level voltage selection signal VSEL. The high-level voltage selection signal VSEL corresponds to the positive voltage VP, which is based on the precharge current Ipcg.

When the first read unit 131 supplies the second read voltage VREAD2 to the memory circuit 120 based on the high-level voltage selection signal VSEL, the memory circuit 120 may generate the cell current Icell based on the second read voltage VREAD2, at step S240. The cell current Icell generated by the memory circuit 120 when the second read voltage VREAD2 is applied corresponds to the resistance state of the read target memory cell 121. For example, when the read target memory cell 121 is in the low resistance state, the memory circuit 120 may generate the cell current Icell at a higher level than the reference current Iref. On the other hand, when the read target memory cell 121 is in the high resistance state, the memory circuit 120 may generate the cell current Icell at a lower level than the reference current Iref.

The second read unit 133 may compare the reference current Iref and the cell current Icell at step S250.

At step S260, when a result of the comparison at step S250 indicates that the cell current Icell is higher than the reference current Iref, i.e., the read target memory cell 121 is in the low resistance state, the second read unit 133 may determine that the read target memory cell 121 is in the low resistance state, and generate the low-level read data signal RD_OUT, which corresponds to the negative voltage VN, regardless of the precharge current Ipcg.

On the other hand, at step S270, when the result of the comparison at S250 indicates that the reference current Iref is higher than the cell current Icell, i.e., the read target memory cell 121 is in the high resistance state, the second read unit 133 may determine that the read target memory cell 121 is in the high resistance state, and generate the high-level read data signal RD_OUT, which corresponds to the positive voltage VP, based on the precharge current Ipcg.

The above-described semiconductor memory can accommodate for memory cells with characteristic distributions that drift over time, and also extend a read window margin of the memory cells. Furthermore, the semiconductor memory can operate using simplified processes by performing the reread operation on a specific memory cell only when the memory cell is determined to have a specific resistance state, i.e., the high resistance state.

For example, the semiconductor memory accommodates for the drift phenomenon by selectively double-checking the resistance state of a memory cell when the memory cell initially appears to have a high resistance state. In this example, the semiconductor memory double-checks whether the memory cell has the high resistance state by rereading the memory cell using a different read voltage.

The above and other memory circuits or semiconductor devices based on the disclosed technology may be used in a range of devices or systems. FIGS. 10-14 provide some examples of devices or systems that may implement the memory circuits disclosed herein.

Figure 10:
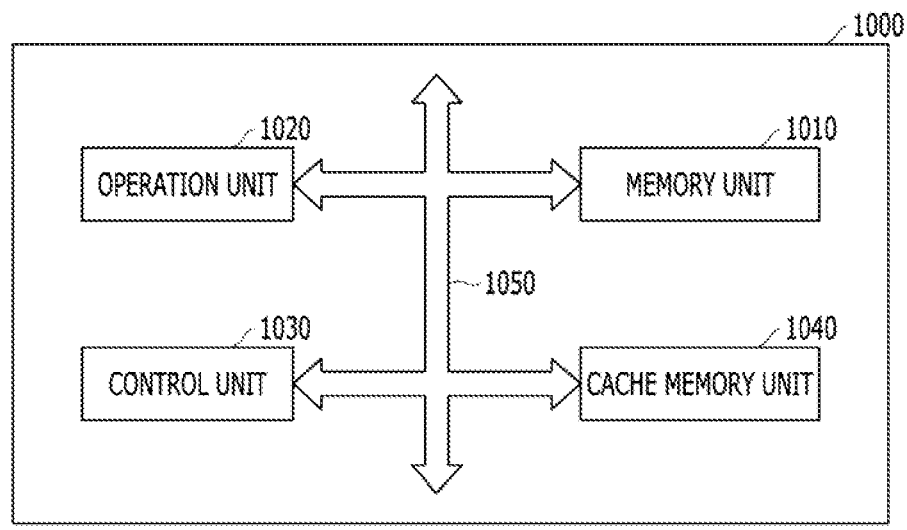
FIG. 10 is an example of a configuration diagram of a microprocessor implementing memory circuitry based on an implementation of the disclosed technology.

FIG. 10 is an example of configuration diagram of a microprocessor implementing memory circuitry based on the disclosed technology.

Referring to FIG. 10, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be any of various data processing units, such as a central processing unit (CPU), a graphic processing unit (GPU), a digital signal processor (DSP) and an application processor (AP).

The memory unit 1010 is a part which stores data in the microprocessor 1000, as a processor register, or the like. The memory unit 1010 may include a data register, an address register, a floating point register, and so on. The memory unit 1010 may additionally include various registers. The memory unit 1010 may perform the function of temporarily storing data for which operations are to be performed by the operation unit 1020, result data of performing the operations, and addresses the where data for performing the operations are stored.

The memory unit 1010 may include one or more of the above-described semiconductor devices in accordance with implementations of the present disclosure. For example, the memory unit 1010 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Using the memory circuit according to an implementation of the present disclosure, characteristics of the memory unit 1010 may be improved. As a consequence, performance characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
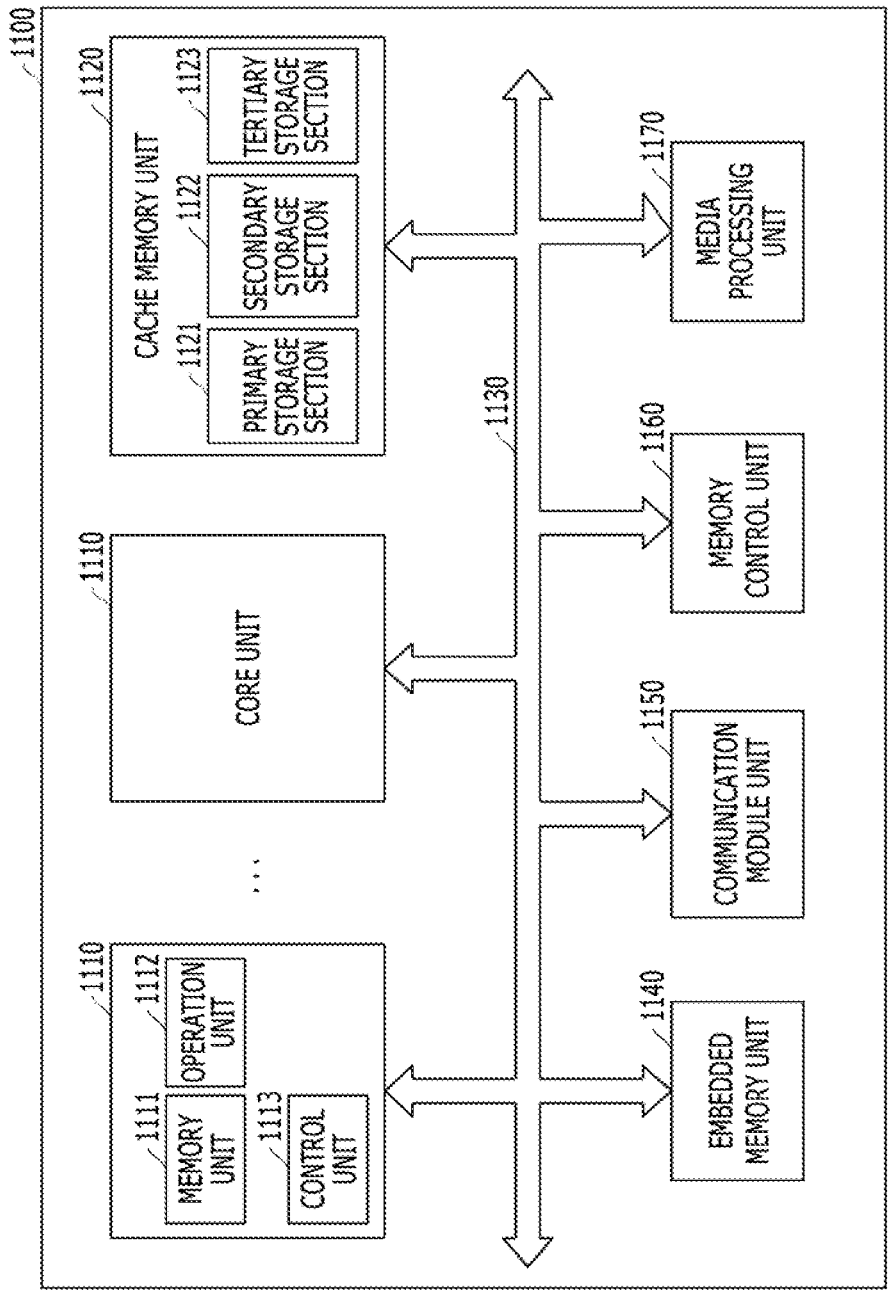
FIG. 11 is an example of a configuration diagram of a processor implementing memory circuitry based on an implementation of the disclosed technology.

FIG. 11 is an example of configuration diagram of a processor implementing memory circuitry based on the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 for storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112, and a control unit 1113.

The memory unit 1111 is a part which stores data in the processor 1100, as a processor register, a register, or the like. The memory unit 1111 may include a data register, an address register, a floating point register, and so on. Besides, the memory unit 1111 may include various registers. The memory unit 1111 may perform the function of temporarily storing data for which operations are to be performed by the operation unit 1112, result data of performing the operations, and addresses where data for performing the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112, and an external device of the processor 1100; perform extraction, decode commands; control input and output of signals of processor 1100; and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be designed according to a desired application of the cache memory unit 1120. The speeds at which the primary, secondary, and tertiary storage sections 1121, 1122, and 1123 store and discriminate data may be the same or different. In the case where the speeds of the respective storage sections 1121, 1122, and 1123 are different, the speed of the primary storage section 1121 may be largest. At least one storage section of the primary storage section 1121, the secondary storage section 1122, and the tertiary storage section 1123 of the cache memory unit 1120 may include one or more of the above-described semiconductor devices in accordance with implementations. For example, the cache memory unit 1120 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Using a memory circuit according to an implementation of the present disclosure, characteristics of the cache memory unit 1120 may be improved. As a consequence, performance characteristics of the processor 1100 may be improved.

Although it is shown in FIG. 11 that all the primary, secondary, and tertiary storage sections 1121, 1122, and 1123 are configured inside the cache memory unit 1120, it is to be noted that all the primary, secondary, and tertiary storage sections 1121, 1122, and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110, and tertiary storage section 1123 may be disposed outside the core units 1110.

The bus interface 1130 is a part which connects the core unit 1110, the cache memory unit 1120, and an external device, and which allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory, but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network, or both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice, and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 12:
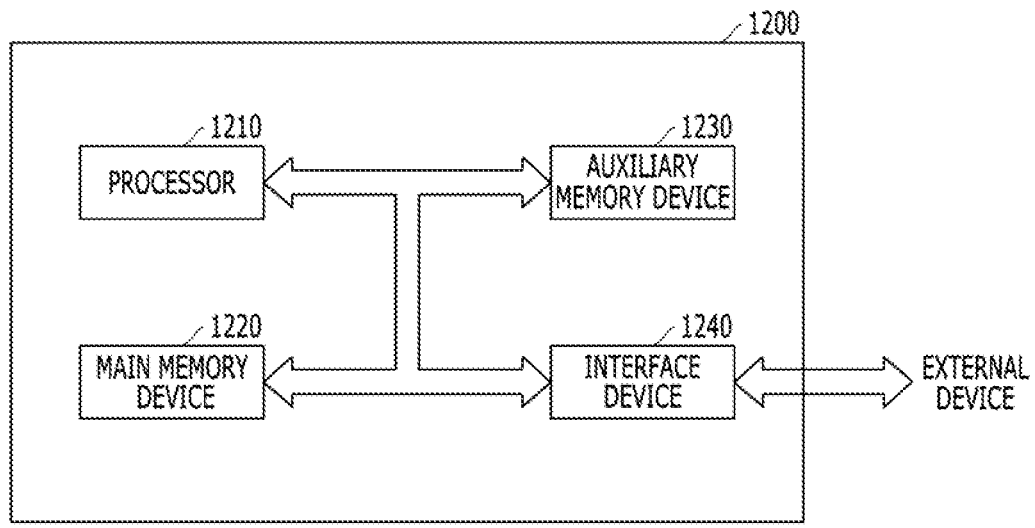
FIG. 12 is an example of a configuration diagram of a system implementing memory circuitry based on an implementation of the disclosed technology.

FIG. 12 is an example of configuration diagram of a system implementing memory circuitry based on the disclosed technology.

Referring to FIG. 12, a system 1200 as an apparatus for processing data may perform input, processing, output, communication, storage, etc. to conduct a series of manipulations of data. The system 1200 may include a processor 1210, a main memory device 1220, an auxiliary memory device 1230, an interface device 1240, and so on. The system 1200 of the present implementation may be any of various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which may temporarily store, call, and execute program codes or data from the auxiliary memory device 1230 when programs are executed, and can conserve memorized contents even when power supply is cut off. The main memory device 1220 may include one or more of the above-described semiconductor devices in accordance with the implementations. For example, the main memory device 1220 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Through this, characteristics of the main memory device 1220 may be improved. As a consequence, performance characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Through this, characteristics of the auxiliary memory device 1230 may be improved. As a consequence, performance characteristics of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be configured to perform exchange of commands and data between the system 1200 of the present implementation and an external device. The interface device 1240 may include any of a keypad, a keyboard, a mouse, a speaker, a microphone, a display, various human interface devices (HIDs), a communication device, and so on. The communication device may include a module capable of being connected with a wired network, a module capable of being connected with a wireless network, or both. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 13:
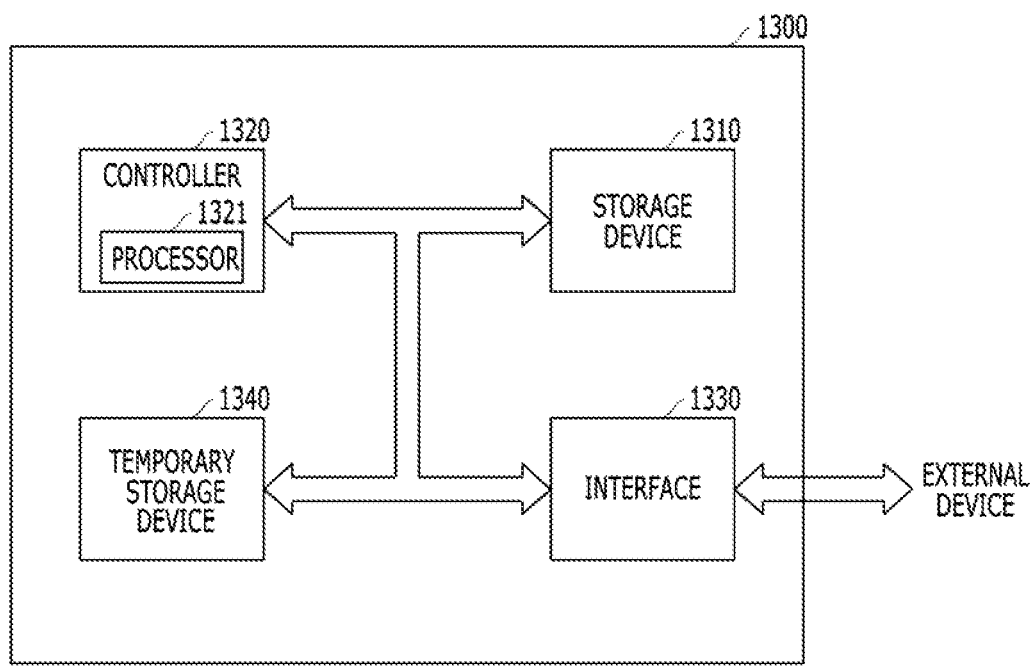
FIG. 13 is an example of a configuration diagram of a data storage system implementing memory circuitry based on an implementation of the disclosed technology.

FIG. 13 is an example of configuration diagram of a data storage system implementing memory circuitry based on the disclosed technology.

Referring to FIG. 13, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on; and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above-mentioned interfaces. The interface 1330 may be compatible with one or more interfaces having different types from each other.

The temporary storage device 1340 can store data temporarily for efficiently transferring data between the interface 1330 and the storage device 1310 according to diversifications and high-performance implementations of an interface with an external device, a controller, and a system. The temporary storage device 1340 for temporarily storing data may include one or more of the above-described semiconductor devices in accordance with the implementations. For example, the temporary storage device 1340 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Through this, characteristics of the temporary storage device 1340 may be improved. As a consequence, performance characteristics of the system 1300 may be improved.

Figure 14:
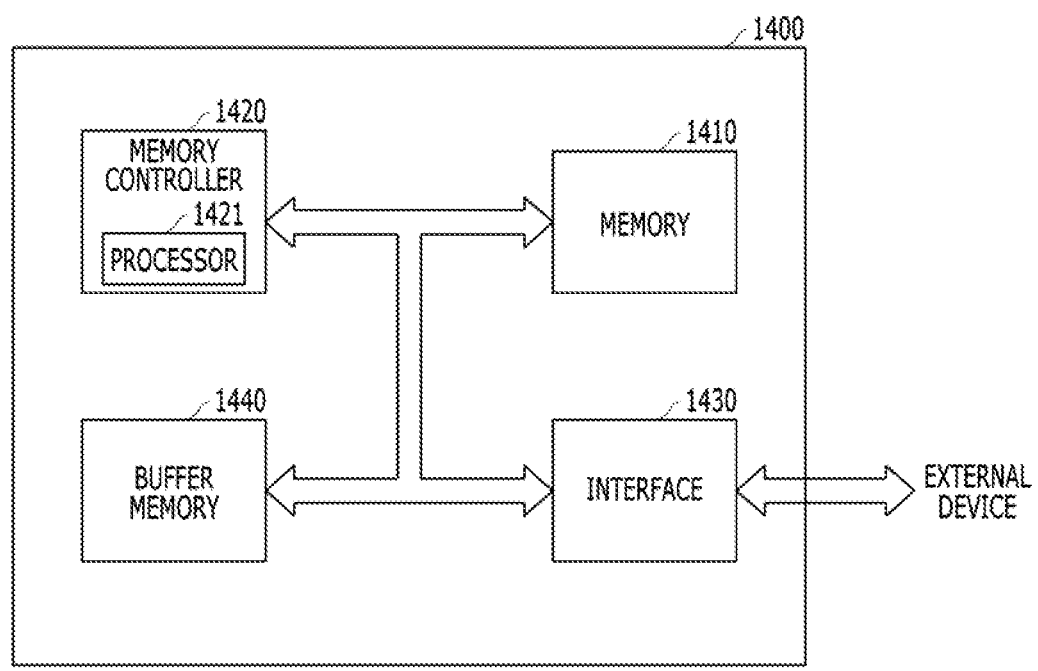
FIG. 14 is an example of a configuration diagram of a memory system implementing memory circuitry based on an implementation of the disclosed technology.

FIG. 14 is an example of configuration diagram of a memory system implementing memory circuitry based on the disclosed technology.

Referring to FIG. 14, a memory system 1400 may include a memory 1410, which is a component for storing data having a nonvolatile characteristic, a memory controller 1420, which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Through this, characteristics of the memory 1410 may be improved. As a consequence, performance characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have nonvolatile characteristics.

The memory controller 1420 may control exchange of data between the memory 1410 and the interface 1430. To this end, the memory controller 1420 may include a processor 1421 for performing an operation for and processing commands inputted through the interface 1430 from a source outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having different types from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a memory circuit comprising a plurality of memory cells; a read circuit suitable for reading data one or more times from one or more read target memory cells among the plurality of memory cells, based on a read control signal; and a control circuit suitable for determining whether to reread data from the read target memory cell based on a data value of the read data, and generating the read control signal according to the determination result. Through this, characteristics of the buffer memory 1440 may be improved. As a consequence, performance characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have nonvolatile characteristics.

As is apparent from the above descriptions, in the semiconductor device and the method for fabricating the same in accordance with the disclosed implementations, a resistance variable element may be easily patterned, and the characteristics of the resistance variable element may be secured.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment.

Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. A method of driving an electronic device including a semiconductor memory, the method comprising:
setting, during a test mode, first and second read voltages in consideration of a characteristic distribution of a plurality of memory cells;
generating a first read data signal by reading, during a normal mode, data from a read target memory cell among the plurality of memory cells; and
deciding, during the normal mode, to reread the data from the read target memory cell only when a data value of the first read data signal corresponds to a high resistance state of the read target memory cell.

2. The method of claim 1, wherein the setting of the first and second read voltages comprises:
measuring a first characteristic distribution from the plurality of memory cells before a drift occurs;
measuring a second characteristic distribution from the plurality of memory cells after the drift occurs; and
setting the first read voltage based on the first characteristic distribution, and setting the second read voltage based on the second characteristic distribution.

3. The method of claim 2, wherein the first characteristic distribution comprises a first threshold voltage distribution of the plurality of memory cells when the plurality of memory cells are each in a low resistance state, and a second threshold voltage distribution of the plurality of memory cells when the plurality of memory cells are each in a high resistance state, and
wherein the first read voltage is set to level halfway between a highest voltage level in the first threshold voltage distribution and a lowest voltage level in the second threshold voltage distribution, or to a level that is closer to the highest voltage level in the first threshold voltage distribution than the lowest voltage level in the second threshold voltage distribution.

4. The method of claim 3, wherein the second characteristic distribution comprises a third threshold voltage distribution of the plurality of memory cells when the plurality of memory cells are each in the low resistance state, and a fourth threshold voltage distribution of the plurality of memory cells when the plurality of memory cells are each in the high resistance state, and
wherein the second read voltage is set to a level that is closer to the lowest voltage level in the fourth threshold voltage distribution than the highest voltage level in the third threshold voltage distribution, or to a level that is closer to the lowest voltage level in the second threshold voltage distribution than the highest voltage level in the first threshold voltage distribution.

5. The method of claim 1, further comprising:
generating a second read data signal by rereading the data from the read target memory cell.

6. The method of claim 1, wherein an absolute value of the second read voltage is greater than an absolute value of the first read voltage.

7. A method of driving an electronic device including a semiconductor memory, the method comprising:
setting, during a test mode, first and second read voltages in consideration of a characteristic distribution of a plurality of memory cells;
generating a first read data signal by reading, during a normal mode, data from a read target memory cell among the plurality of memory cells; and
deciding, during the normal mode, to reread the data from the read target memory cell based on a data value of the first read data signal, and
wherein the setting of the first and second read voltages comprises:
measuring a first characteristic distribution from the plurality of memory cells before a drift occurs;
measuring a second characteristic distribution from the plurality of memory cells after the drift occurs; and
setting the first read voltage based on the first characteristic distribution, and setting the second read voltage based on the second characteristic distribution.

8. The method of claim 7, wherein the drift is a phenomenon in which a resistance value of each of the plurality of memory cells changes.

9. The method of claim 7, wherein the first characteristic distribution comprises a first threshold voltage distribution of the plurality of memory cells when the plurality of memory cells are each in a low resistance state, and a second threshold voltage distribution of the plurality of memory cells when the plurality of memory cells are each in a high resistance state, and
wherein the first read voltage is set to level halfway between a highest voltage level in the first threshold voltage distribution and a lowest voltage level in the second threshold voltage distribution, or to a level that is closer to the highest voltage level in the first threshold voltage distribution than the lowest voltage level in the second threshold voltage distribution.

10. The method of claim 9, wherein the second characteristic distribution comprises a third threshold voltage distribution of the plurality of memory cells when the plurality of memory cells are each in the low resistance state, and a fourth threshold voltage distribution of the plurality of memory cells when the plurality of memory cells are each in the high resistance state, and
wherein the second read voltage is set to a level that is closer to the lowest voltage level in the fourth threshold voltage distribution than the highest voltage level in the third threshold voltage distribution, or to a level that is closer to the lowest voltage level in the second threshold voltage distribution than the highest voltage level in the first threshold voltage distribution.

11. The method of claim 7, wherein the deciding to reread the data comprises deciding to reread the data from the read target memory cell when the data value of the first read data signal corresponds to a high resistance state of the read target memory cell.

12. The method of claim 7, further comprising:
generating a second read data signal by rereading the data from the read target memory cell,
wherein the deciding to reread the data comprises deciding to reread the data from the read target memory cell when the data value of the first read data signal corresponds to a high resistance state of the read target memory cell.

13. The method of claim 7, wherein an absolute value of the second read voltage is greater than an absolute value of the first read voltage.

* * * * *